United States Patent
Zhao et al.

(10) Patent No.: US 10,433,055 B2
(45) Date of Patent: Oct. 1, 2019

(54) SPEAKER SYSTEM WITH MOVING VOICE COIL

(71) Applicant: Goertek Inc., Shandong (CN)

(72) Inventors: Guodong Zhao, Shandong (CN); Pengcheng Ji, Shandong (CN); Xinfeng Yang, Shandong (CN)

(73) Assignee: GOERTEK, INC., Weifang (CN)

( * ) Notice: Subject to any disclaimer, the term of this patent is extended or adjusted under 35 U.S.C. 154(b) by 0 days.

(21) Appl. No.: 16/138,721

(22) Filed: Sep. 21, 2018

(65) Prior Publication Data

US 2019/0028804 A1    Jan. 24, 2019

Related U.S. Application Data

(63) Continuation of application No. PCT/CN2016/083089, filed on May 24, 2016.

(30) Foreign Application Priority Data

Mar. 21, 2016    (CN) .......................... 2016 1 0160980

(51) Int. Cl.
*H04R 9/02* (2006.01)
*H04R 9/06* (2006.01)
(Continued)

(52) U.S. Cl.
CPC ............. *H04R 3/007* (2013.01); *H04R 3/002* (2013.01); *H04R 9/02* (2013.01); *H04R 9/025* (2013.01);
(Continued)

(58) Field of Classification Search
CPC ........ H04R 29/001; H04R 3/007; H04R 9/02; H04R 9/025; H04R 9/06; H04R 3/002;
(Continued)

(56) References Cited

U.S. PATENT DOCUMENTS

| | | | |
|---|---|---|---|
| 2010/0301699 A1* | 12/2010 | Zhang | B81B 3/0021 310/300 |
| 2012/0177211 A1 | 7/2012 | Yamkovoy et al. | |
| 2018/0035212 A1 | 2/2018 | Shao et al. | |

FOREIGN PATENT DOCUMENTS

| CN | 1554208 | 12/2004 |
|---|---|---|
| CN | 204518064 | 7/2015 |

(Continued)

OTHER PUBLICATIONS

First Search, Chinese application No. 201610160980.0 (2 pages).
(Continued)

*Primary Examiner* — Vivian C Chin
*Assistant Examiner* — Friedrich Fahnert
(74) *Attorney, Agent, or Firm* — Patent Law Works LLP

(57) ABSTRACT

The present invention discloses a speaker system with a moving voice coil. A conductive material layer is disposed on a front cover of the speaker system and constitutes a fixed electrode plate. A vibrating component comprises a flexible circuit board secured to one side of a vibrating diaphragm. A metal layer is disposed in the middle of the flexible circuit board and constitutes a movable electrode plate. The fixed electrode plate is electrically connected to an external circuit by means of an external terminal disposed on a front cover solder pad. The flexible circuit board extends to the outside of the speaker system and is provided with a solder pad electrically connected to the external circuit. A capacitance monitoring chip is disposed in the speaker system and electrically connected to a capacitor.

10 Claims, 3 Drawing Sheets

(51) Int. Cl.
    *H05K 1/11*       (2006.01)
    *H04R 3/00*       (2006.01)
    *H04R 29/00*     (2006.01)
    *H05K 1/02*       (2006.01)
    *H05K 1/18*       (2006.01)
    *H05K 7/14*       (2006.01)

(52) U.S. Cl.
    CPC .............. *H04R 9/06* (2013.01); *H04R 29/001* (2013.01); *H05K 1/028* (2013.01); *H05K 1/11* (2013.01); *H05K 1/181* (2013.01); *H05K 7/1427* (2013.01); *H05K 2201/10083* (2013.01); *H05K 2201/10151* (2013.01)

(58) Field of Classification Search
    CPC .......... H05K 1/028; H05K 1/11; H05K 1/181; H05K 2201/10083; H05K 2201/10151; H05K 7/1427
    USPC ......... 381/59, 117, 345, 386, 395, 396, 398, 381/400, 409
    See application file for complete search history.

(56) References Cited

FOREIGN PATENT DOCUMENTS

| | | | |
|---|---|---|---|
| CN | 204948356 | | 1/2016 |
| CN | 204948356 | U * | 1/2016 |
| CN | 204993820 | | 1/2016 |
| CN | 205029868 | U | 2/2016 |
| CN | 205622853 | | 10/2016 |
| WO | 2013143262 | A1 | 10/2013 |

OTHER PUBLICATIONS

Second Office Action, Chinese application No. 201610160980.0, dated Sep. 29, 2018 (9 pages).
International Search Report and Written Opinion, PCT/CN2016/083089, dated Dec. 4, 2016 (6 pages).
First Office Action, Chinese application No. 201610160980.0, dated Feb. 26, 2018 (8 pages).

* cited by examiner

SPEAKER SYSTEM WITH MOVING VOICE COIL

CROSS-REFERENCE TO RELATED APPLICATIONS

This application is a Continuation of International Application No. PCT/CN2016/083089, filed on May 24, 2016, which claims priority to Chinese Patent Application No. 201610160980.0, filed on Mar. 21, 2016, both of which are hereby incorporated by reference in their entireties.

FIELD OF THE INVENTION

The present invention relates to the technical field of electroacoustic products, and in particular to a speaker system with a moving voice coil.

BACKGROUND OF THE INVENTION

Smart power amplifiers (Smart PA) have been already more and more extensively applied to various terminal products at present. This sets new requirements for monitoring vibration displacement of a vibrating component (driver) of a speaker. In general, a smart PA monitors vibration displacement of a vibrating diaphragm in real time, predicts real-time displacement of the vibrating component by comparison between existing models and detected parameters, and guarantees that the vibrating component always works in a safe state.

However, there are always some deviations between physical parameters of mass-produced speakers. Under actual working conditions, vertical displacement of a vibrating system may be inconsistent. That is, there will be no guarantee of 100% consistency of the speakers. The smart PA needs to reserve enough allowance for protecting the vibrating component. At present, the maximum amplitude of the vibrating component may be influenced by the precision of detection and of the models during control of the smart PA, which predicts displacement of the vibrating component through comparison between the models and detected parameters. Consequently, original performance of the vibrating component may not be given to full play.

To solve this problem, there emerged a solution that a capacitor is formed in a speaker system to monitor real-time vibration amplitude of the speaker so as to protect the speaker in real time. However, in the prior art, a capacitance monitoring chip configured to acquire capacitance data is usually disposed outside the speaker system. The capacitor needs to be communicated with the chip outside. This leads to a relatively complicated product process design, a relatively lower degree of integration, and an undesirable real-time monitoring effect on the vibration amplitude of the speaker.

Therefore, it is necessary to put forward a technical solution in which actual displacement of the vibrating component of the speaker may be accurately monitored in real time for protecting the speaker in real time. Meanwhile, the product design process should be simplified as much as possible.

SUMMARY OF THE INVENTION

An objective of the present invention is to provide a novel technical solution in which the actual displacement of a vibrating component of a speaker may be accurately monitored in real time.

The first aspect of the present invention provides a speaker system with a moving voice coil, which sequentially comprises a front cover, a vibrating component and a magnetic circuit component from top to bottom. The front cover is provided with a conductive material layer which constitutes a fixed electrode plate. The vibrating component comprises a vibrating diaphragm and a voice coil secured to the lower surface of the vibrating diaphragm and disposed in a magnetic gap formed by the magnetic circuit component. The vibrating component further comprises a flexible circuit board secured to one side of the vibrating diaphragm. A metal layer is disposed in the middle of the flexible circuit board and constitutes a movable electrode plate. A front cover solder pad is disposed on the front cover. An external terminal is disposed on the front cover solder pad. The fixed electrode plate is electrically connected to an external circuit by means of the external terminal. The flexible circuit board extends to the outside of the speaker system and is provided with a solder pad electrically connected to the external circuit. The fixed electrode plate and the movable electrode plate are opposite to each other. Charges accumulate on the fixed electrode plate and the movable electrode to constitute a capacitor after the front cover and the flexible circuit board are electrified. A capacitance monitoring chip is further disposed in the speaker system with the moving voice coil and is electrically connected to the capacitor.

Preferably, the capacitance monitoring chip is disposed on the flexible circuit board.

Preferably, a smart power amplifier chip is further disposed on the flexible circuit board.

Preferably, the front cover is partially made of conductive iron, copper or aluminum or is made of a non-conductive material. The fixed electrode plate of the capacitor is formed by electroplating an iron, copper or aluminum conductive material layer.

Preferably, the metal layer is a copper foil.

Preferably, the flexible circuit board is secured between the vibrating diaphragm and the voice coil. The voice coil is electrically connected to the flexible circuit board. A current signal of the external circuit is transmitted to the voice coil by means of the solder pad disposed on the flexible circuit board.

Preferably, the vibrating component further comprises a vibrating diaphragm reinforcing portion secured to the upper surface of the vibrating diaphragm. A hole is formed in the center of each of the vibrating diaphragm and the vibrating diaphragm reinforcing portion. The capacitance monitoring chip is disposed in the hole.

Preferably, the flexible circuit board is secured to the upper surface of the vibrating diaphragm.

Preferably, a capacitance solder pad is disposed on the flexible circuit board. The movable electrode plate is electrically connected to the capacitance monitoring chip by means of the capacitance solder pad.

Preferably, a lead solder pad is disposed on the flexible circuit board. The voice coil is electrically connected to the smart power amplifier chip by means of the lead solder pad.

The capacitor and the capacitance monitoring chip are disposed in the speaker system, such that the actual displacement of the vibrating component of the speaker may be accurately monitored in real time. A monitoring signal may be utilized to intelligently adjust the power of an audio signal input into the speaker system. Thus, the speaker system may not be damaged by overload. Besides, as the capacitance monitoring chip is built in the speaker system, high integration of the speaker is facilitated. The product process is simplified. The production cost is lowered.

Further features of the present invention, as well as advantages thereof, will become apparent from the following detailed description of exemplary embodiments of the present invention with reference to the attached drawings.

BRIEF DESCRIPTION OF THE DRAWINGS

The accompanying drawings, which are incorporated in and constitute a part of the specification, illustrate embodiments of the present invention and, together with the description, serve to explain the principles of the present invention.

REFERENCE NUMBERS IN THE DRAWINGS

1—front cover; 2—vibrating diaphragm reinforcing portion; 3—vibrating diaphragm; 4—flexible circuit board; 5—voice coil; 6—housing; 7—washer; 8—magnet; 9—frame; 10—speaker chip; 11—front cover solder pad; 12—external terminal; 13—lead solder pad; 14—capacitance solder pad.

DETAILED DESCRIPTION OF THE EMBODIMENTS

Various exemplary embodiments of the present invention will now be described in detail with reference to the accompanying drawings. It should be noted that the relative arrangement of the components and steps, numerical expressions and numerical values set forth in these embodiments do not limit the scope of the present invention unless it is specifically stated otherwise.

The following description of at least one exemplary embodiment is merely illustrative in nature and by no means is to be construed as any limitation on the present invention and its application or use.

Techniques, methods, and apparatuses known to one of ordinary skill in the relevant art may not be discussed in detail but, where appropriate, the techniques, methods, and apparatuses should be considered part of the description.

In all of the examples shown and discussed herein, any specific value should be interpreted as merely illustrative and not as a limitation. Therefore, other examples of the exemplary embodiments may have different values.

It should be noted that like reference numbers and letters represent similar terms in the following figures, and therefore, an item needs not to be further discussed in subsequent figures as soon as it is defined in a previous drawing.

The present invention provides a speaker system with a moving voice coil. A capacitor configured to detect vibration displacement of a vibrating component of a speaker in real time and a capacitance monitoring chip are disposed in the speaker system. The capacitor consists of a movable electrode plate and a fixed electrode plate opposite to the movable electrode plate. The movable electrode plate is part of the vibrating component and vibrates therewith. The fixed electrode plate is disposed on a front cover of the speaker. A voice coil drives the vibrating component including the movable electrode plate to vibrate with the vibrating component under the action of an electromagnetic field when the speaker system with the moving voice coil is input with an audio signal. Change of the distance between the movable electrode plate and the fixed electrode plate results in capacitance change of the capacitor. Actual displacement of the vibrating component may be known by utilizing the capacitance monitoring chip to monitor capacitive reactance change of the capacitor.

Figure 1:
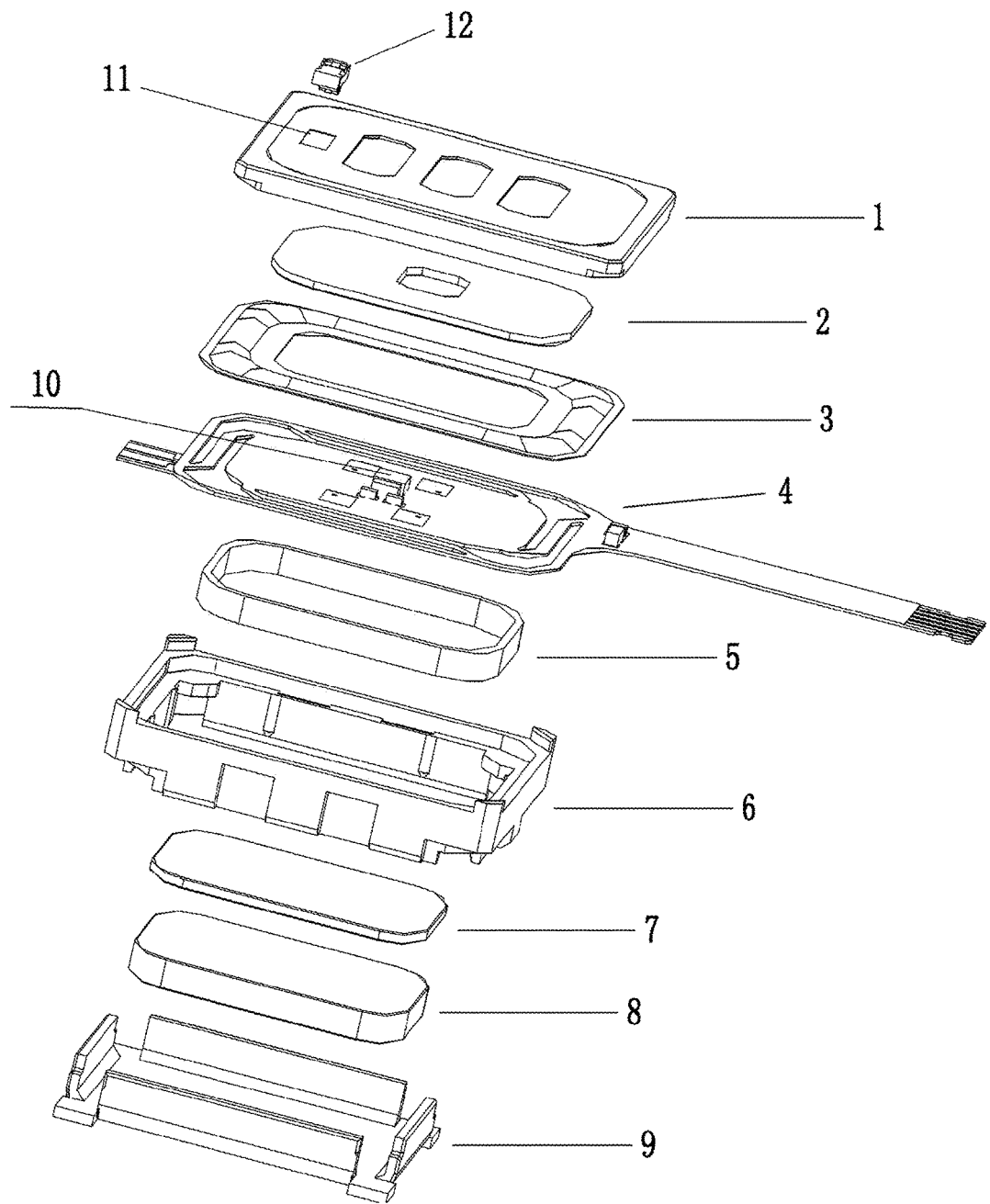
FIG. 1 is an exploded schematic view of a speaker system in one embodiment of the present invention.
Figure 2:
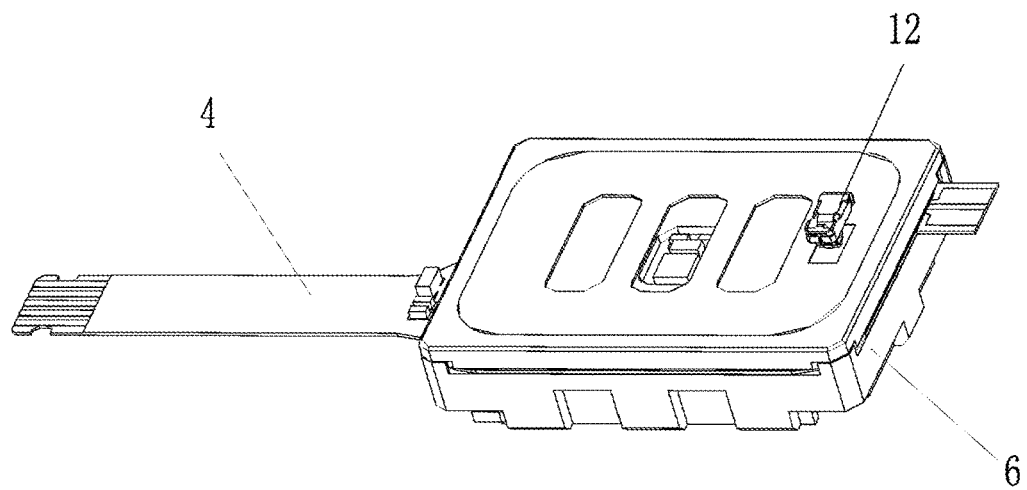
FIG. 2 is a perspective schematic view of a speaker system in one embodiment of the present invention.
Figure 3:
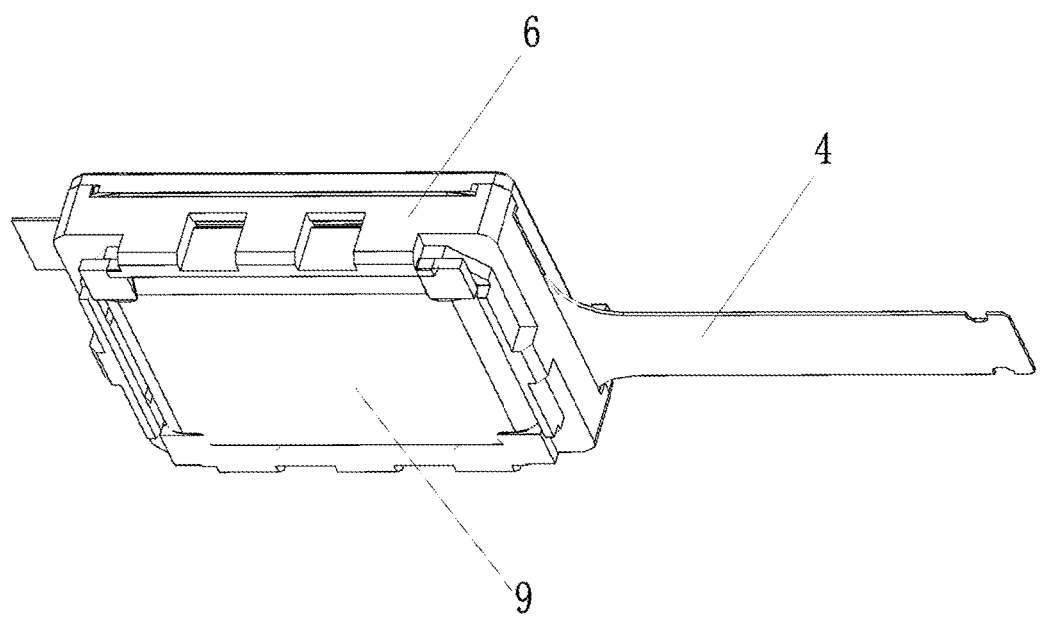
FIG. 3 is a perspective schematic view of another perspective of a speaker system in one embodiment of the present invention.
Figure 4:
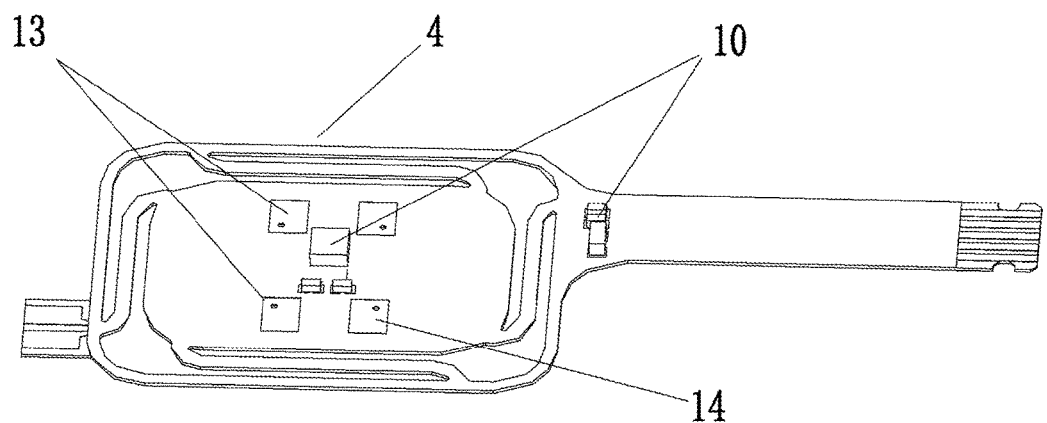
FIG. 4 is a structural schematic view of a flexible circuit board of a speaker system in one embodiment of the present invention.
Figure 5:
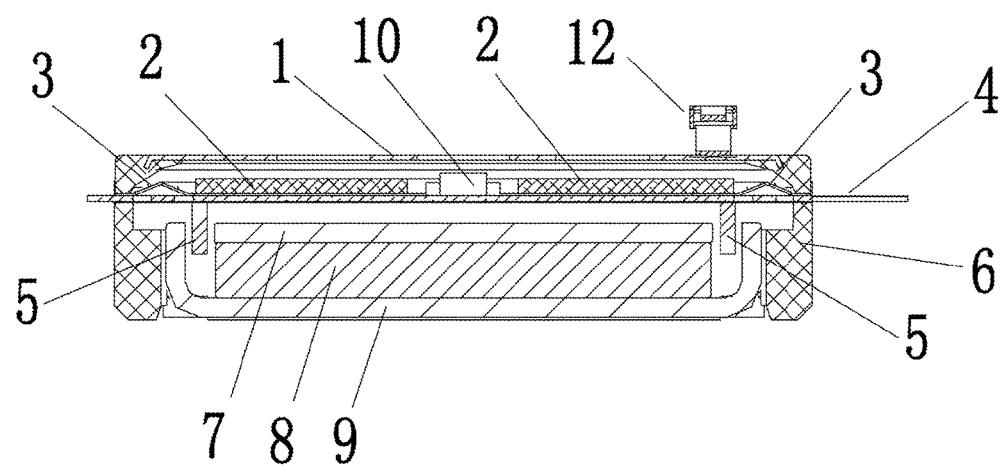
FIG. 5 is a sectional schematic view of a speaker system in one embodiment of the present invention.

Referring to FIGS. 1 to 5 which illustrate embodiments of the speaker system with the moving voice coil, the speaker system with the moving voice coil sequentially comprises a front cover 1, a vibrating component and a magnetic circuit component from top to bottom, and further comprises a housing 6. The front cover 1 and the housing 6 are combined together to form a cavity to accommodate the vibrating component and the magnetic circuit component.

The front cover 1 is provided with a conductive material layer. During specific implementation, on the one hand, the conductive material layer (such as iron, copper or aluminum) may be attached onto the lower surface of the front cover 1 made of a non-conductive material (for example, plastic), by means of electroplating. On the other hand, part of the front cover 1 may be made of a conductive material (such as iron, copper or aluminum). The conductive material here constitutes a fixed electrode plate.

The vibrating component sequentially comprises a vibrating diaphragm reinforcing portion (DOME) 2, a vibrating diaphragm 3, a flexible circuit board 4 and a voice coil 5 from top to bottom. The vibrating diaphragm reinforcing portion 2 is secured to the center of the upper surface of the vibrating diaphragm 3. The flexible circuit board 4 is secured between the vibrating diaphragm 3 and the voice coil 5. In other embodiments, the flexible circuit board 4 may be secured to the upper surface of the vibrating diaphragm 3. A metal layer is disposed in the middle of the flexible circuit board 4 and constitutes a movable electrode plate. Preferably, the metal layer is a copper foil. The fixed electrode plate and the movable electrode plate are opposite to each other. It is well known that charges may accumulate on the two electrode plates to constitute a capacitor (a parallel-plate capacitor structure) after the fixed electrode plate and the movable electrode plate are electrified within a certain distance.

Particularly, in this application, a front cover solder pad 11 is disposed on the front cover 1. An external terminal 12 is disposed on the front cover solder pad 11. The fixed electrode plate of the capacitor is electrically connected to an external circuit by means of the external terminal 12. The flexible circuit board 4 comprises a main body portion and a tail end which extends to the outside of the speaker system. A solder pad configured to be electrically connected to the external circuit is disposed on the tail end. The movable electrode plate is electrically connected to the external circuit by means of the solder pad. Thus, the fixed electrode plate and the movable electrode plate are electrified and charges accumulate on the two electrode plates when the front cover 1 and the flexible circuit board 4 are connected with the external circuit.

The magnetic circuit component sequentially comprises a washer 7, a magnet 8 and a frame 9 from top to bottom. A magnetic gap is formed between the magnet 8 and a side wall of the frame 9. The voice coil 5 is suspended in the magnetic gap. The magnetic circuit component may further consist of a central washer, a central magnet, an edge washer and an edge magnet. That is, the application may be applicable to speaker systems with moving voice coils, which are of single-magnetic-circuit structures or multi-magnetic-circuit structures.

In this application, connection of the external circuit in the speaker system with the moving voice coil is actually realized by means of the voice coil 5 and the flexible circuit board 4. Particularly, a current signal of the external circuit is transmitted to the flexible circuit board 4 by means of the solder pad disposed on the tail end of the flexible circuit board 4. The voice coil 5 is electrically connected to the flexible circuit board 4 (a voice coil wire is welded with the flexible circuit board 4). Thus, the current signal is transmitted to the voice coil 5. The voice coil 5 reciprocates to cut magnetic lines of force to drive the vibrating diaphragm 3 and the flexible circuit board 4 to vibrate after receiving the current signal of the external circuit. The principle in this part is the general operating principle of a speaker with a moving voice coil. As common sense, it will not be repeated herein.

Furthermore, in this application, in order to monitor the vibration displacement more accurately in real time, improve the integration degree of the product and lower the cost, a capacitance monitoring chip that is usually disposed outside a speaker system with a moving voice coil and configured to monitor capacitance changes in the prior art is disposed inside the speaker system. From FIG. 1, FIG. 4 and FIG. 5, it can be seen that the flexible circuit board 4 is provided with a speaker chip 10, and the speaker chip 10 at least should comprise the capacitance monitoring chip and may further comprise a smart power amplifier chip. In another embodiment, the capacitance monitoring chip and the smart power amplifier chip may further be integrated in a chip. In another embodiment, the smart power amplifier chip may further be disposed outside the speaker system.

A capacitance solder pad 14 and two lead solder pads 13 are disposed on the flexible circuit board 4. The movable electrode plate of the capacitor is electrically connected to the capacitance monitoring chip by means of the capacitance solder pad 14. An output end of the smart power amplifier chip is electrically connected to the voice coil 5 by means of the lead solder pads 13.

An audio signal of which the power is adjusted by the smart power amplifier chip is output to the voice coil 5. The movable electrode plate vibrates along with the voice coil 5 to lead to change of the distance between the two electrode plates. This results in capacitance change of the capacitor. The capacitance monitoring chip is connected to the capacitor, monitors change of the capacitance or capacitive reactance of the capacitor in real time and feeds a monitoring signal back to the smart power amplifier chip, so that the smart power amplifier chip may intelligently adjust the power of the audio signal. For example, a safety threshold of the monitoring signal may be set in the smart power amplifier chip. If the monitoring signal exceeds the safety threshold, the power input into the speaker is reduced. The capacitance monitoring chip and the smart power amplifier chip belong to the prior art, and their concrete structures will not be repeated in the present invention.

The vibrating diaphragm 3 comprises a planar portion located in the center, a fixed portion secured to the housing 6 and an edge portion through which the planar portion and the fixed portion are connected. The vibrating diaphragm reinforcing portion 2 is disposed on the planar portion of the vibrating diaphragm 3. A hole is formed in the center of each of the vibrating diaphragm 3 and the vibrating diaphragm reinforcing portion 2. The speaker chip (such as the capacitance monitoring chip and/or the smart power amplifier chip) may be located in the hole, such that the internal space of the speaker system may be saved. The speaker system is more compact. Cooling of the speaker chip is facilitated.

The main body portion of the flexible circuit board 4 comprises a center portion and an outer ring portion surrounding the center portion. An area between the center portion and the outer ring portion is largely hollowed out. The center portion and the outer ring portion are connected only by means of several connecting arms. The edge portion of the vibrating diaphragm 2 corresponds to the hollowed-out portion and the connecting arm portions of the flexible circuit board 4, so that the compliance of the vibrating diaphragm 2 may be less influenced by the flexible circuit board 4.

As the capacitor and the capacitance monitoring chip are disposed in the speaker system, the actual displacement of the vibrating component of the speaker may be accurately monitored in real time. A monitoring signal may be utilized to intelligently adjust the power of the audio signal input into the speaker system, such that the speaker system may not be damaged by overload. In addition, the capacitance monitoring chip disposed in the speaker system may acquire capacitance changes more accurately, thereby facilitating optimization of the speaker's performance.

As the movable electrode plate and the capacitance monitoring chip are disposed on the flexible circuit board, high integration of the speaker is facilitated. The technological process is greatly simplified. The cost is lowered. Furthermore, the smart power amplifier chip may be disposed on the flexible circuit board. Thus, the speaker system is more compact. The size of the speaker system may be further reduced.

Although some specific embodiments of the present invention have been described in detail by way of example, those skilled in the art should understand that the above examples are only for the purpose of illustration and are not intended to limit the scope of the present invention. It will be understood by those skilled in the art that the above embodiments may be modified without departing from the scope and spirit of the present invention. The scope of the present invention is defined by the appended claims.

What is claimed is:

1. A speaker system with a moving voice coil, sequentially comprising a front cover, a vibrating component and a magnetic circuit component from top to bottom, wherein
the front cover is provided with a conductive material layer which constitutes a fixed electrode plate;
the vibrating component comprises a vibrating diaphragm and a voice coil secured to the lower surface of the vibrating diaphragm and disposed in a magnetic gap formed by the magnetic circuit component;
the vibrating component further comprises a flexible circuit board secured to one side of the vibrating diaphragm, wherein a metal layer is disposed in the middle of the flexible circuit board and constitutes a movable electrode plate; a front cover solder pad is disposed on the front cover; an external terminal is disposed on the front cover solder pad; the fixed electrode plate is electrically connected to an external circuit by means of the external terminal; the flexible circuit board extends to the outside of the speaker system and is provided with a solder pad electrically connected to the external circuit; the fixed electrode plate and the movable electrode plate are opposite to each other; charges accumulate on the fixed electrode plate and the movable electrode to constitute a capacitor after the front cover and the flexible circuit board are electrified;
a capacitance monitoring chip is further disposed in the speaker system with the moving voice coil and is electrically connected to the capacitor;
the flexible circuit board is secured between the vibrating diaphragm and the voice coil; and
the vibrating component further comprises a vibrating diaphragm reinforcing portion secured to the upper surface of the vibrating diaphragm; a hole is formed in the center of each of the vibrating diaphragm and the vibrating diaphragm reinforcing portion; and the capacitance monitoring chip is disposed in the hole.

2. The speaker system with the moving voice coil according to claim 1, wherein the capacitance monitoring chip is disposed on the flexible circuit board.

3. The speaker system with the moving voice coil according to claim 2, wherein a smart power amplifier chip is further disposed on the flexible circuit board.

4. The speaker system with the moving voice coil according to claim 1, wherein the front cover is partially made of conductive iron, copper or aluminum.

5. The speaker system with the moving voice coil according to claim 1, wherein the metal layer is a copper foil.

6. The speaker system with the moving voice coil according to claim 1, wherein the voice coil is electrically connected to the flexible circuit board; and a current signal of the external circuit is transmitted to the voice coil by means of the solder pad disposed on the flexible circuit board.

7. The speaker system with the moving voice coil according to claim 1, wherein the flexible circuit board is secured to the upper surface of the vibrating diaphragm.

8. The speaker system with the moving voice coil according to claim 1, wherein a capacitance solder pad is disposed on the flexible circuit board; and the movable electrode plate is electrically connected to the capacitance monitoring chip by means of the capacitance solder pad.

9. The speaker system with the moving voice coil according to claim 3, wherein a lead solder pad is disposed on the flexible circuit board; and the voice coil is electrically connected to the smart power amplifier chip by means of the lead solder pad.

10. The speaker system with the moving voice coil according to claim 1, wherein the front cover is partially made of a non-conductive material, and the fixed electrode plate of the capacitor is formed by electroplating an iron, copper or aluminum conductive material layer.

* * * * *